(12) United States Patent
Puchner et al.

(10) Patent No.: US 6,455,363 B1
(45) Date of Patent: Sep. 24, 2002

(54) SYSTEM TO IMPROVE SER IMMUNITY AND PUNCHTHROUGH

(75) Inventors: Helmut Puchner, Santa Clara, CA (US); Gary K. Giust, Cupertino, CA (US); Weiran Kong, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 09/609,527

(22) Filed: Jul. 3, 2000

(51) Int. Cl.[7] .......................................... H01L 21/8238
(52) U.S. Cl. ...................... 438/223; 438/224; 438/227; 438/228
(58) Field of Search ............................... 438/152, 155, 438/210, 223, 224, 227, 228, 238, 381, 382, 384

(56) References Cited

U.S. PATENT DOCUMENTS

| | | | | |
|---|---|---|---|---|
| 5,130,268 A | * | 7/1992 | Liou et al. ...................... | 438/67 |
| 5,741,735 A | * | 4/1998 | Violette et al. .............. | 438/279 |
| 6,133,100 A | * | 10/2000 | Li ................................ | 438/275 |
| 6,140,188 A | * | 10/2000 | Sur et al. ..................... | 438/294 |
| 6,218,866 B1 | * | 4/2001 | Poplevine et al. .......... | 326/106 |

* cited by examiner

Primary Examiner—Carl Whitehead, Jr.
Assistant Examiner—Pamela E. Perkins
(74) Attorney, Agent, or Firm—Luedeka, Neely & Graham, P.C.

(57) ABSTRACT

A method for fabricating an SRAM device having a standard well tub, where an additional well tub is deposited within the standard well tub. In this manner, the dopant concentration is increased in the well area of the SRAM device, which increases both the isolation punchthrough tolerance and the SER immunity of the device. The additional well tub is deposited to a depth that is shallower than the standard well tub. The additional well tub is deposited using an ion implantation process using the same mask set as that used for the threshold voltage adjustment deposition. Thus, no additional mask layer is required to deposit the additional well tub, and the all of the expenses normally associated with an additional mask layer are avoided.

16 Claims, 2 Drawing Sheets

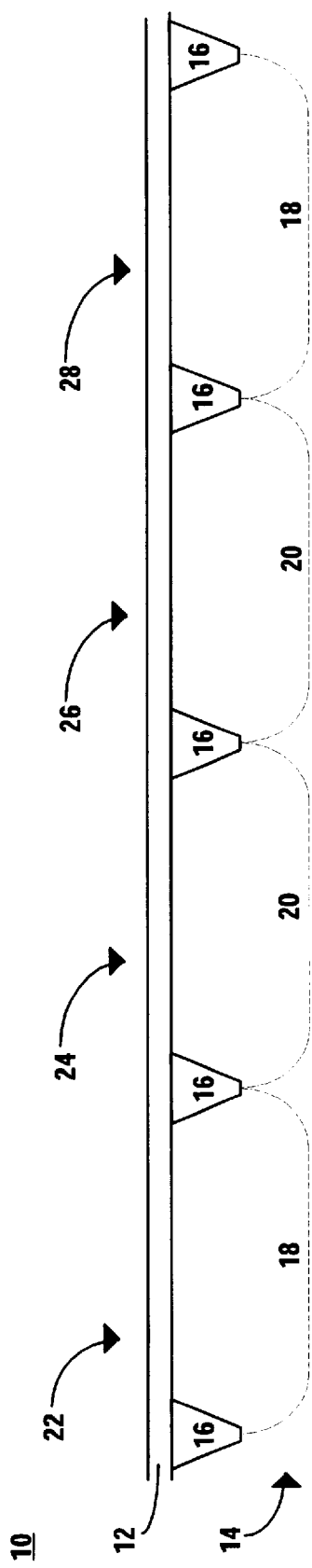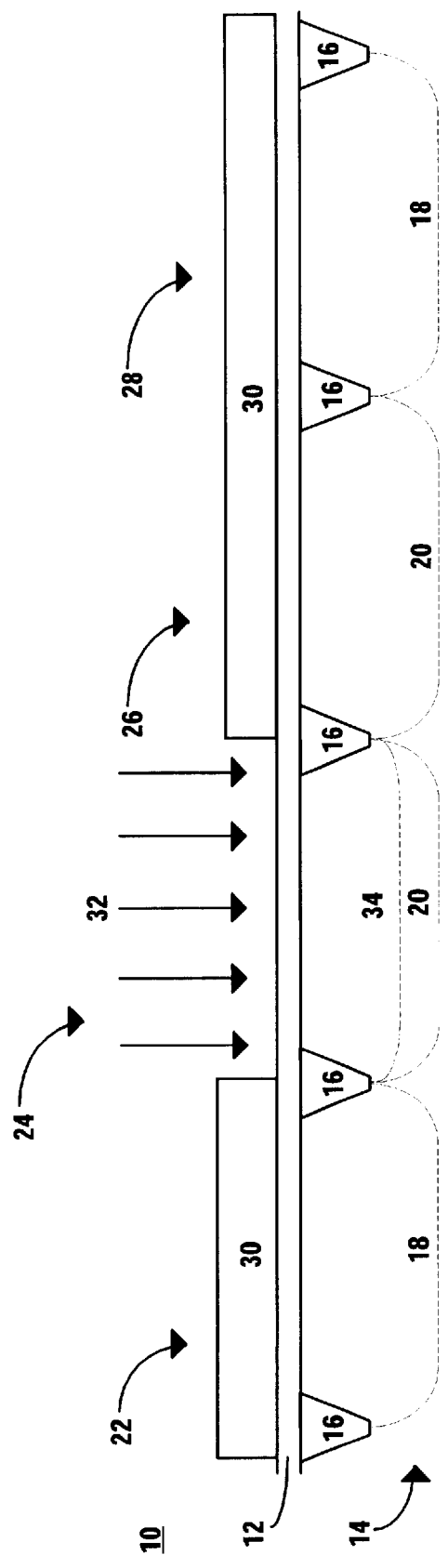

SYSTEM TO IMPROVE SER IMMUNITY AND PUNCHTHROUGH

FIELD

This invention relates to the field of semiconductor wafer processing. More particularly the invention relates to a system for improving the electrical characteristics of static random access memory devices.

BACKGROUND

As semiconductor device geometries shrink, design engineers encounter new problems that tend to reduce the reliability of the devices. In addition, solutions that were developed to overcome previously identified problems may become ineffectual or create other problems as the geometries shrink and other processing constraints change. Thus, there is a continual need to improve upon the methods and structures relied upon in the past.

One issue that is always of high priority is that of maintaining electrical pathway integrity within the device. In other words, ensuring that charge carrier flow is limited to those pathways and those times at which it is desired. For example, it is typically desired to electrically isolate semiconductor devices that are formed adjacent to one another in a semiconducting substrate. This is accomplished in a variety of ways, such as by using locos oxidation or shallow trench isolation techniques. However, as the size of the semiconductor device decreases, the size of these structures must also preferably decrease, which tends to reduce the inherent effectiveness of the isolation structure. This may result in a number of different problems, such as an increase in the soft error rate (SER), where devices become unstable and lose their specified state. Thus, additional systems need to be found to augment the isolation provided by these structures.

As a further example, the ability to open and close the current pathway in a semiconductor device such as a MOS transistor is fundamental to the proper operation of the device. Again, however, as device geometries are reduced, the standard structures that were developed for larger devices tend to be less effectual in preventing inadvertent leakage through the isolation region of smaller transistors. Thus, current interwell punchthrough in the isolation tends to become a bigger problem as the devices are made smaller. Here again, additional systems are needed to augment the strength of the isolation region.

While there may be many systems that could be devised to alleviate these and other problems, they tend to add complexity, expense and time to the device fabrication process. Typically, these added steps come in the form of additional mask layers that must be developed and used. Thus, the financial pressures inherent in semiconductor device fabrication must also be weighed in finding solutions to these conditions.

What is needed, therefore, is a system to improve the soft error rate immunity and isolation punchthrough tolerance of a device, without requiring additional mask layers.

SUMMARY

The above and other needs are met by a method for fabricating an SRAM device having a standard well tub, where an additional well tub is deposited within the standard well tub. The additional well tub is deposited to a depth that is shallower than the standard well tub. In this manner, the dopant concentration is increased in the well area of the SRAM device, which increases both the isolation punchthrough tolerance and the SER immunity of the device.

In a preferred embodiment, the additional well tub is deposited using an ion implantation process to a depth that is shallower than the standard well tub. Further, the SRAM device is preferably isolated from adjacent devices with a shallow trench isolation structure that extends to a depth, and the additional well tub is deposited to a depth that is deeper than the depth of the shallow trench isolation structure. In a most preferred embodiment, the additional well tub is implanted using the same mask set as that used for the threshold voltage adjustment deposition of the SRAM device. Thus, in the preferred embodiment, no additional mask layer is required to deposit the additional well tub, and all of the expenses normally associated with an additional mask layer are avoided.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 1 is a cross-sectional dopant profile of a standard well tub,

FIG. 2 is a cross-sectional dopant profile of a semiconductor device receiving the additional well tub deposition.

DETAILED DESCRIPTION

Figure 3:
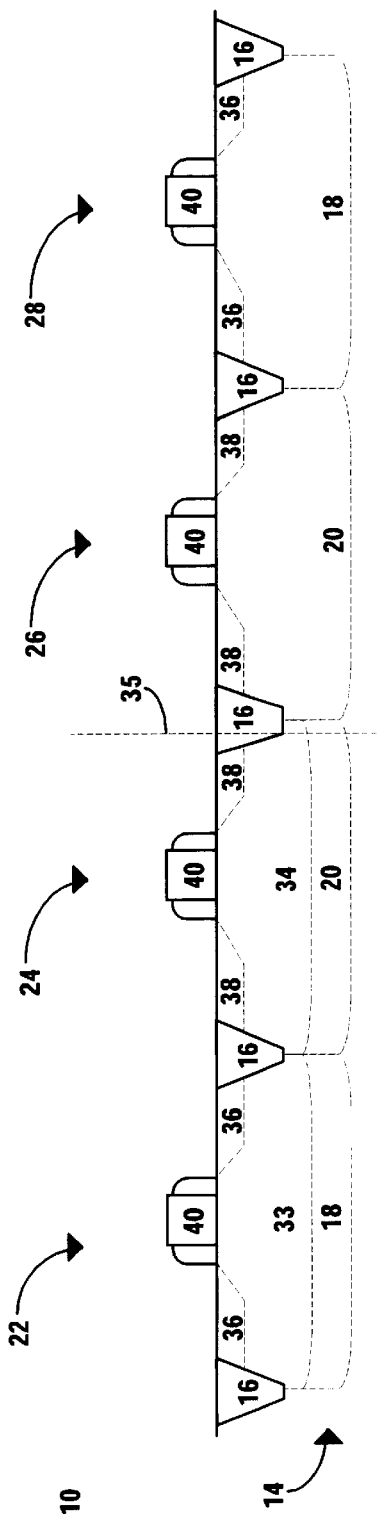
FIG. 3 is a cross-sectional dopant profile of a semiconductor device after receiving the additional well tub deposition.

Turning now to the drawings, there is depicted in FIG. 1 a cross-sectional view of a substrate 10 having semiconductor device regions 22, 24, 26, and 28 in a wafer 14. In the depiction of FIG. 1, the devices that will be formed in device regions 22, 24, 26, and 28 are only in the very beginning phases of construction. At the phase depicted, isolation structures 16, such as shallow trench isolation oxide structures, have been formed in the semiconductor material 14. Wells 18 and 20 have also been formed. In the embodiment depicted, wells 18 represent N doped wells and wells 20 represent P doped wells. A layer of sacrificial oxide 12 has been deposited over the surface of the substrate 14.

In FIG. 2, a layer of photoresist 30 has been deposited on the sacrificial oxide 12. The photoresist 30 has been cured, exposed, developed, and baked to provide a deposition mask on the substrate 10. Through the openings in the photoresist 30, such as the opening that is overlying the semiconductor device region 24, a dopant 32 is deposited through the sacrificial oxide layer 12 and into the semiconductor material 14. The dopant material 32 is selected to be of the same type, either P or N, as the well of the device region into which it is deposited. Therefore, in the embodiment depicted in FIG. 2, the dopant 32 is a P type species, because the well 20 is P type.

The dopant 32 is preferably deposited to a depth that is greater than the isolation structure 16 and shallower than the well 20. In this manner, the additional dopant 32 is concentrated within a region 34 of the device 24 where it provides a higher junction capacitance for the device 24, thus enhancing SER immunity, and also strengthens the channel region that is to be further defined at later stages of the processing, thus enhancing deep channel punchthrough resistance as well as increasing interwell punchthrough resistance. This region 34 is essentially the deposition of an additional well 34.

An additional benefit of this system is that the mask layers and methods used to form the photoresist layer 30 are not in addition to those required for the standard processing of the devices 22, 24, 26, and 28. The reason for this is that an SRAM device, such as device 24, typically requires a threshold depletion deposition, which uses a mask structure that is identical to that described above and depicted in FIG. 2. Thus, after the dopant 32 for the additional well 34 has been deposited, the threshold depletion dopant can be deposited. In this manner, only a single deposition step is added to the fabrication process, without any additional mask layer processing required.

Further, this system is compatible with the fabrication of SRAM devices 22 and 24 that are formed on the same substrate 10 as logic devices 26 and 28, which do not typically require a threshold depletion deposition. Thus, the processing used to enhance the electrical characteristics of the SRAM devices 22 and 24 does not add complexity to the processing of or degrade the performance of the logic devices 26 and 28.

A similar mask layer is used to provide a photoresist mask layer through which to deposit a similar well structure 33 into the SRAM device 22 as depicted in FIG. 3. As mentioned above, this is the same mask layer through which the threshold adjustment layer for the SRAM device 22 is deposited. Thus, the formation of the additional well 33 does not require any additional masking steps, and likewise does not impact the fabrication or reliability of the logic devices 26 and 28. Similar to that as described above, because the dopant used for the well 18 is N type, the dopant used for the additional well 33 is also N type.

Figure 4:
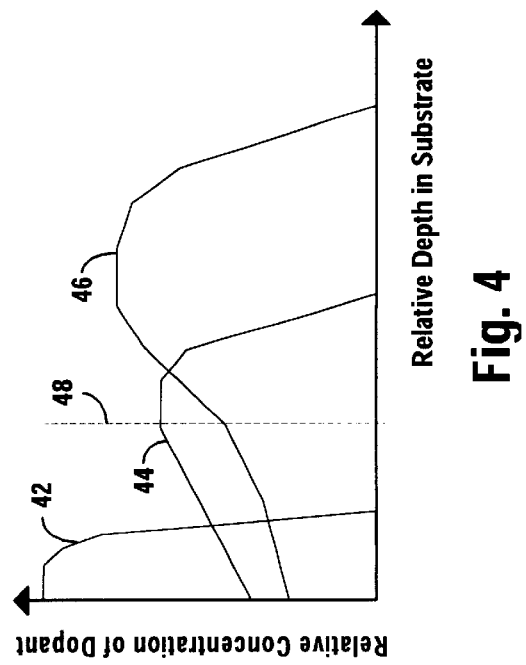
FIG. 4 is a dopant profile chart.

FIG. 3 depicts the devices 22, 24, 26, and 28 at a later stage of processing, where the sacrificial oxide layer 12 has been removed, gate structures 40 have been created, and source and drain regions have been deposited with P+ dopant 36 and N+ dopant 38. FIG. 4 depicts the relative concentration of the various dopants as a function of depth in semiconductor material 14, as viewed along section 35 in FIG. 3. Line 42 represents the concentration of the N+ source/drain region 38, line 44 represents the concentration of the P additional well 34, and line 46 represents the concentration of the standard P well 20. Line 48 represents the depth of the bottom of the isolation structure 16.

As seen in FIG. 4, that portion of the additional well 34 at which the concentration of dopant is the greatest as represented by line 44 on the chart of FIG. 4, extends to a depth in the semiconductor material 14 that is greater than the depth of the isolation structure 16 as represented by line 48 on the chart of FIG. 4. Further, that portion of the additional well 34 at which the concentration of dopant is the greatest, as represented by line 44 on the chart of FIG. 4, extends to a depth in the semiconductor material 14 that is shallower or less than the depth of that portion of the standard well 20 at which the concentration of dopant is the greatest, as represented by line 46 on the chart of FIG. 4.

In a most preferred embodiment, the dopants for the various structures are deposited using an ion implantation process. Thus, for example, the additional P well 34 of SRAM device 24 may be preferably formed by ion implantation of Boron ($B_{11}$) at an energy of between about 25 keV and about 190 keV and a ion dose of between about $10^{11}$ ions/cm$^2$ and about $10^{14}$ ions/cm$^2$, which implants the species at a nominal depth of between about 0.1 microns and about 0.5 microns. The additional N well 33 of SRAM device 22 may be preferably formed by ion implantation of Phosphorus ($P_{31}$) at an energy of between about 80 keV and about 360 keV and a ion dose of between about $10^{11}$ ions/cm$^2$ and about $10^{14}$ ions/cm$^2$, which implants the species at a nominal depth of between about 0.1 microns and about 0.5 microns.

As is apparent from the foregoing discussion, the dopant type of the additional well tubs 33 or 34 is the same as the dopant type of the corresponding standard well tubs 18 or 20, respectively. Thus, other dopant species of the corresponding dopant type, whether P or N, may be used in place of those specifically described in the example above. For a standard well tub 18 or 20 having a nominal concentration of about $10^{18}$ ions/cm$^3$, the doses described above yield a resultant concentration of between about $10^{17}$ ions/cm$^3$ and about $10^{20}$ ions/cm$^3$ within the additional well tubs 33 and 34. The processes described above are preferably used when the nominal depth of the standard well tubs 18 and 20 is between about 0.2 microns and about 1.0 microns, and the depth of the isolation structures 16 is between about 0.08 microns and about 0.45 microns. For standard well tubs 18 and 20 having different nominal depths and dopant concentrations, and for isolation structures 16 having different depths, the processes described above for the deposition of the additional well tubs 33 and 34 would be adjusted commensurately.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. In a method for fabricating an SRAM device having a standard well tub disposed in a substrate and bounded by shallow trench isolation structures disposed in the substrate, the improvement comprising the step of depositing an additional well tub within the standard well tub, wherein the additional well tub is deposited to a depth that is shallower than the standard well tub and deeper than the shallow trench isolation structures, and implanting a threshold adjustment layer in the substrate for the SRAM device using a threshold voltage adjustment mask set applied to the substrate.

2. The method of claim 1 wherein the additional well tub is deposited to a depth of between about 0.1 microns and about 0.5 microns.

3. The method of claim 1 wherein the additional well tub is deposited to a concentration of between about $10_{17}$ ions per cubic centimeter and about $10^{20}$ ions per cubic centimeter.

4. The method of claim 1 wherein the standard well tub is doped P type and the additional well tub is deposited with Boron at an energy of between about 25 keV and about 190 keV.

5. The method of claim 1 wherein the standard well tub is doped N type and the additional well tub is deposited with Phosphorous at an energy of between about 80 keV and about 360 keV.

6. The method of claim 1 wherein the additional well tub is deposited with a dose of between about $10^{11}$ ions per square centimeter and about $10^{14}$ ions per square centimeter.

7. The method of claim 1 wherein the additional well tub is deposited prior to implanting a threshold adjustment layer using the voltage adjustment mask set.

8. A method for increasing SER immunity and isolation punchthrough tolerance of an SRAM device comprising:

depositing a first dopant for the SRAM device in a semiconductor substrate to provide a first well tub, the first well tub having a first dopant depth and the first well tub isolated from adjacent well tubs by shallow trench isolation structures in the substrate wherein the shallow trench isolation structures have an isolation depth that is shallower than the first dopant depth, depositing a second dopant in the first well tub to a second dopant depth that is shallower than the first dopant depth and deeper than the isolation depth to provide a second well tub within the first well tub, and masking the substrate above the first well tub with a threshold voltage adjustment mask set and implanting a threshold voltage layer in the substrate for the SCRAM device.

9. The method of claim 8 wherein the second well tub is deposited to a depth of between about 0.1 microns and about 0.5 microns.

10. The method of claim 8 wherein the second well tub is deposited to a concentration of between about $10^{17}$ ions per cubic centimeter and about $10^{20}$ ions per cubic centimeter.

11. The method of claim 8 wherein the standard well tub is doped P type and the second well tub is deposited with Boron at an energy of between about 25 keV and about 190 keV.

12. The method of claim 8 wherein the standard well tub is doped N type and the second well tub is deposited with Phosphorous at an energy of between about 80 keV and about 360 keV.

13. The method of claim 8 wherein the second well tub is deposited with a dose of between about $10^{11}$ ions per square centimeter and about $10^{14}$ ions per square centimeter.

14. The method of claim 8 wherein the second dopant for the second well tub is deposited using the threshold voltage adjustment mask set prior to implanting a threshold voltage layer in the substrate.

15. In a method for fabricating an SRAM device having a standard lower well tub disposed in a substrate and bounded by shallow trench isolation structures disposed in the substrate the improvement comprising the step of depositing an additional upper well tub within the standard well tub, wherein the additional well tub is deposited to a depth that is shallower than the standard well tub and deeper than the shallow trench isolation structures, and the additional upper well tub has a dopant concentration that is greater than the standard lower well tub.

16. A method for increasing SER immunity and isolation punchthrough tolerance of an SRAM device comprising:

depositing a first dopant for the SRAM device in a semiconductor substrate to provide a first lower well tub, the first lower well tub having a first dopant depth and the first lower well tub isolated from adjacent well tubs by shallow trench isolation structures in the substrate wherein the shallow trench isolation structures have an isolation depth that is shallower than the first dopant depth, and depositing a second dopant in the first lower well tub to a second dopant depth that is shallower than the first dopant depth and deeper than the isolation depth to provide a second upper well tub within the first lower well tub, where the second upper well tub has a dopant concentration that is greater than the first lower well tub.

* * * * *